(12) United States Patent
Ono et al.

(10) Patent No.: US 12,130,158 B2
(45) Date of Patent: Oct. 29, 2024

(54) TOUCH SENSOR DEVICE AND ELECTRONIC DEVICE EQUIPPED WITH TOUCH SENSOR DEVICE

(71) Applicant: SONY SEMICONDUCTOR SOLUTIONS CORPORATION, Kanagawa (JP)

(72) Inventors: Kazutoshi Ono, Kanagawa (JP); Nobuhiko Shigyo, Kanagawa (JP); Hideo Maeda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 143 days.

(21) Appl. No.: 17/760,403

(22) PCT Filed: Dec. 28, 2020

(86) PCT No.: PCT/JP2020/049178
§ 371 (c)(1),
(2) Date: Aug. 9, 2022

(87) PCT Pub. No.: WO2021/166464
PCT Pub. Date: Aug. 26, 2021

(65) Prior Publication Data
US 2023/0074648 A1 Mar. 9, 2023

(30) Foreign Application Priority Data
Feb. 17, 2020 (JP) ................................. 2020-024260

(51) Int. Cl.
*G01D 5/24* (2006.01)
*G06F 3/041* (2006.01)
*G06F 3/044* (2006.01)

(52) U.S. Cl.
CPC ........... *G01D 5/24* (2013.01); *G06F 3/04186* (2019.05); *G06F 3/044* (2013.01)

(58) Field of Classification Search
CPC ........ G06F 3/04186; G06F 3/044; G01D 5/24
See application file for complete search history.

(56) References Cited

FOREIGN PATENT DOCUMENTS

JP      2007-334690 A      12/2007
JP        2007334690        * 12/2007
(Continued)

OTHER PUBLICATIONS

International Search Report and Written Opinion of PCT Application No. PCT/JP2020/049178, issued on Feb. 16, 2021, 08 pages of ISRWO.

*Primary Examiner* — Alesa Allgood
(74) *Attorney, Agent, or Firm* — CHIP LAW GROUP

(57) ABSTRACT

The present disclosure provides a touch sensor device that can improve efficiency of acquiring signal components and that can effectively address noise and electromagnetic interference. The touch sensor device includes a driver unit that drives an electrode having a capacitance that changes due to contact, using a voltage having a waveform of any shape, the voltage gradually changing from a first voltage value that is higher than a reference voltage to a second voltage value that is lower than the reference voltage, and from the second voltage value to the first voltage value, a monitor unit that monitors a drive current obtained by driving the electrode, a rectifying unit that performs full-wave rectification of the current monitored by the monitor unit, and a smoothing unit that smooths the rectified current and converts the rectified current to a current that corresponds to the capacitance of the electrode.

7 Claims, 8 Drawing Sheets

(56) References Cited

FOREIGN PATENT DOCUMENTS

| | | |
|---|---|---|
| JP | 2011-133260 A | 7/2011 |
| JP | 2015-027041 A | 2/2015 |
| JP | 6375423 B2 | 8/2018 |

* cited by examiner

FIG. 6A
(1-1) OSCILLATION WAVEFORM
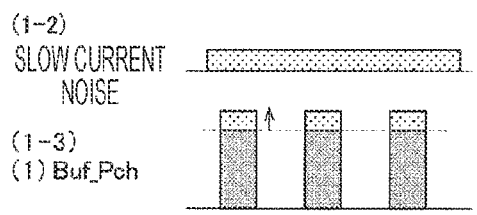
(1-2) SLOW CURRENT NOISE
(1-3) (1) Buf_Pch — ADDED DURING Push
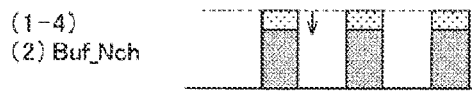
(1-4) (2) Buf_Nch — SUBTRACTED DURING Push
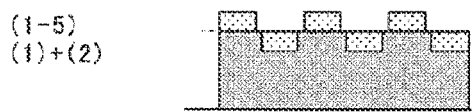
(1-5) (1)+(2) — CANCEL NOISE WHEN ADDED
FIG. 6B
(2-1) OSCILLATION WAVEFORM
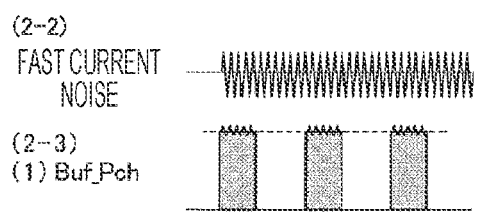
(2-2) FAST CURRENT NOISE
(2-3) (1) Buf_Pch
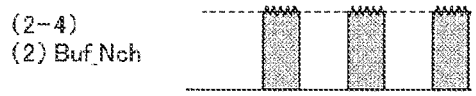
(2-4) (2) Buf_Nch
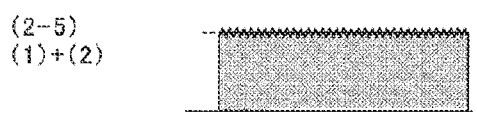
(2-5) (1)+(2)
FIG. 7
(1) OSCILLATION WAVEFORM
(2) SYNCHRONIZATION NOISE
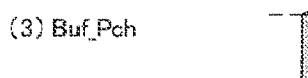
(3) Buf_Pch
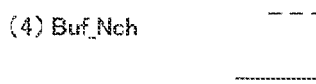
(4) Buf_Nch
(5)

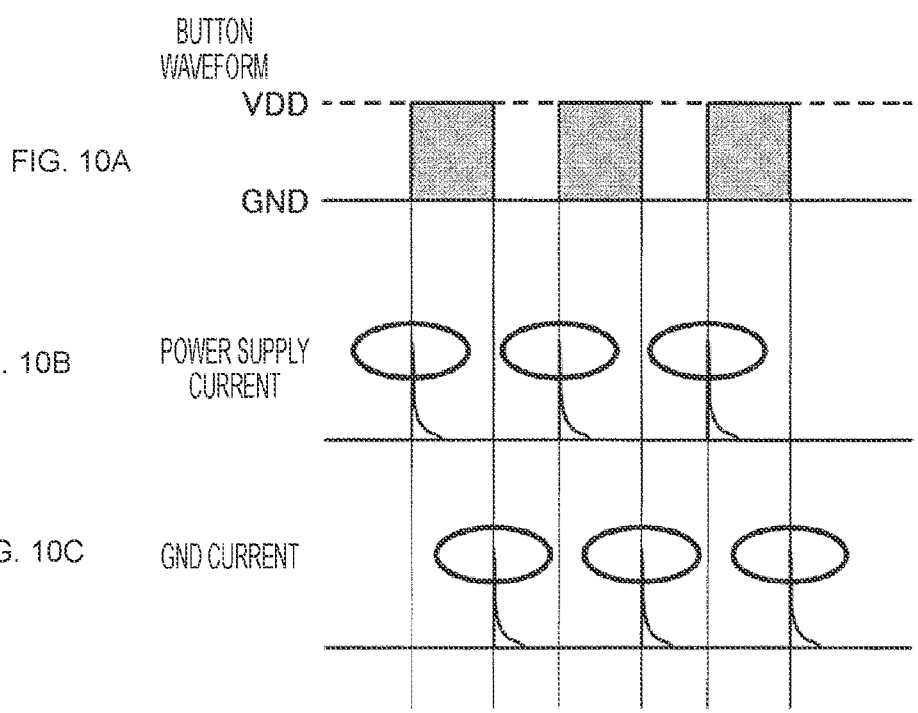

TOUCH SENSOR OUTPUT

AFTER CAPACITIVE
COUPLING OF
TOUCH SENSOR

FIG. 12A  SIN WAVEFORM  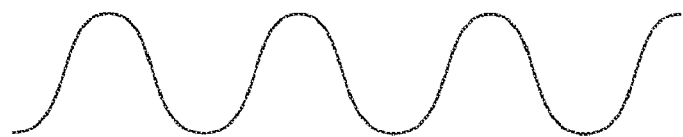
FIG. 12B  BUF CURRENT  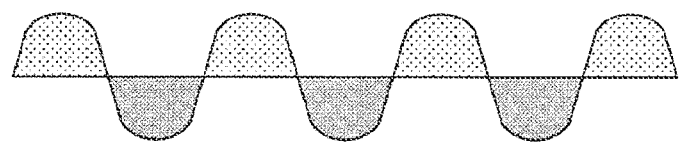
FIG. 12C  RECTIFIED CURRENT  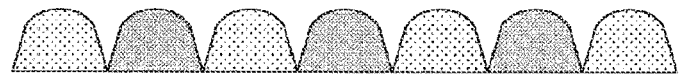
FIG. 13
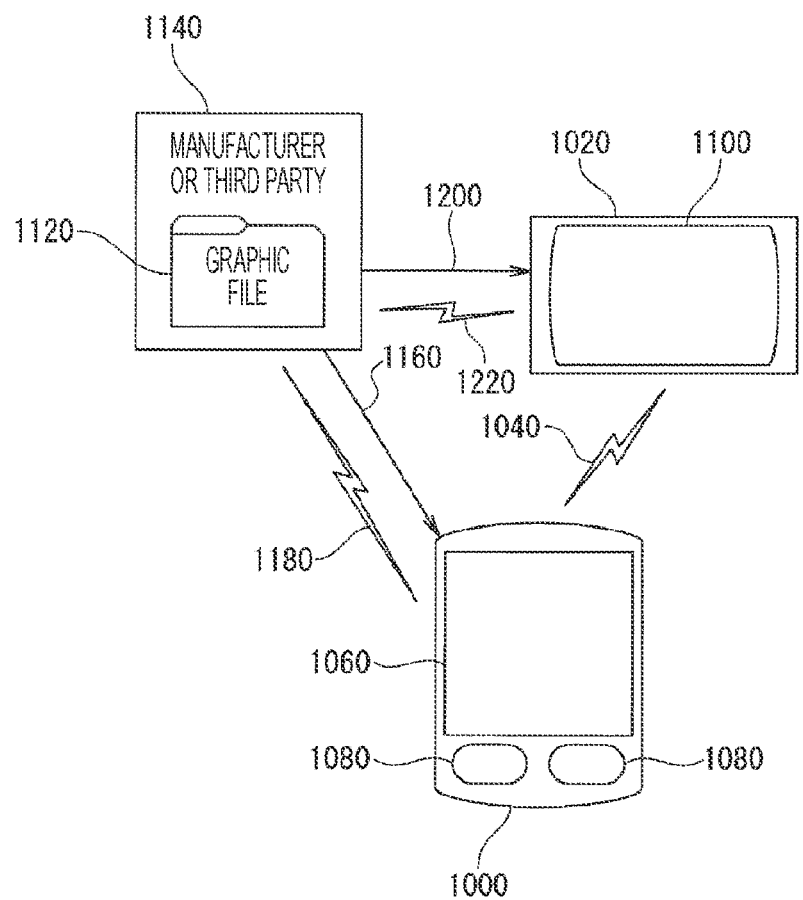

TOUCH SENSOR DEVICE AND ELECTRONIC DEVICE EQUIPPED WITH TOUCH SENSOR DEVICE

CROSS REFERENCE TO RELATED APPLICATIONS

This application is a U.S. National Phase of International Patent Application No. PCT/JP2020/049178 filed on Dec. 28, 2020, which claims priority benefit of Japanese Patent Application No. JP 2020-024260 filed in the Japan Patent Office on Feb. 17, 2020. Each of the above-referenced applications is hereby incorporated herein by reference in its entirety.

TECHNICAL FIELD

The present disclosure relates to a touch sensor device and an electronic device including the touch sensor device.

BACKGROUND ART

There are touch sensor devices in the technical field of touch keys and touch screens. In the touch sensor device, the capacitance changes when a user touches a touch electrode. Due to the change in capacitance, the oscillation frequency of an oscillator changes, and the touch state is detected by detecting the frequency change of a frequency signal transmitted from the oscillator.

However, since the oscillation frequency of the oscillator is susceptible to interference noise of an inverter device, a wireless device, or the like, and an external environment such as temperature and humidity, erroneous detection may occur due to these factors. Examples of the erroneous detection include a situation in which the touch on the touch electrode by the user is not detected and a situation in which it is detected that the user touches the touch electrode, although the user does not touch the touch electrode.

Meanwhile, a touch sensor device using a switched capacitor or the like has been proposed as an example of preventing erroneous detection by a conventional touch sensor device (see Patent Document 1).

CITATION LIST

Patent Document

Patent Document 1: Japanese Patent No. 6375423

SUMMARY OF THE INVENTION

Problems to be Solved by the Invention

However, in the technology disclosed in Patent Document 1 described above, efficiency of acquiring signals is low when the capacitance of the touch electrode is converted into a current.

In addition, in the technology disclosed in Patent Document 1 described above, noise synchronized with an operation clock of the switched capacitor can be canceled, but noise extremely slower than the operation clock cannot be canceled.

Further, the touch sensor device may be mounted on a radio frequency (RF) communication chip such as a chip for Bluetooth low energy (BLE) (Bluetooth is a registered trademark) communication. In this case, a radio wave transmitted and received from an antenna may enter the touch electrode and turn into disturbance noise. Conversely, when the touch sensor device drives the touch electrode, the radio wave may interfere with an RF reception circuit.

The present disclosure has been accomplished in view of such circumstances, and an object of the present disclosure is to provide a touch sensor device capable of efficiently acquiring a signal component and achieving resistance to disturbance noise and reduction in radiation noise, and an electronic device including the touch sensor device.

Solutions to Problems

One aspect of the present disclosure provides a touch sensor device that includes: a driver unit that drives an electrode having a capacitance that changes due to contact, using a voltage having a waveform of any shape, the voltage gradually changing from a first voltage value that is higher than a reference voltage to a second voltage value that is lower than the reference voltage, and from the second voltage value to the first voltage value; a monitor unit that monitors a drive current obtained by driving the electrode; a rectifying unit that performs full-wave rectification of the current monitored by the monitor unit; and a smoothing unit that smooths the rectified current and converts the rectified current to a current that corresponds to the capacitance of the electrode.

Another aspect of the present disclosure provides an electronic device including a touch sensor device that includes: a driver unit that drives an electrode having a capacitance that changes due to contact, using a voltage having a waveform of any shape, the voltage gradually changing from a first voltage value that is higher than a reference voltage to a second voltage value that is lower than the reference voltage, and from the second voltage value to the first voltage value; a monitor unit that monitors a drive current obtained by driving the electrode; a rectifying unit that performs full-wave rectification of the current monitored by the monitor unit; and a smoothing unit that smooths the rectified current and converts the rectified current to a current that corresponds to the capacitance of the electrode.

BRIEF DESCRIPTION OF DRAWINGS

FIGS. 6A and 6B are timing charts of the touch sensor device according to the embodiment for describing a countermeasure for noise.

FIG. 7 is a timing chart of the touch sensor device according to the embodiment when noise synchronized with an oscillation waveform occurs.

FIGS. 10A, 10B, and 10C are timing charts of a touch sensor device according to a comparative example for describing radiation noise.

FIGS. 12A, 12B, and 12C are timing charts of a touch sensor device according to a modification of the embodiment.

FIG. 13 is a block diagram illustrating a schematic configuration example of a system for enabling remote control of an electronic device.

MODE FOR CARRYING OUT THE INVENTION

Figure 1:
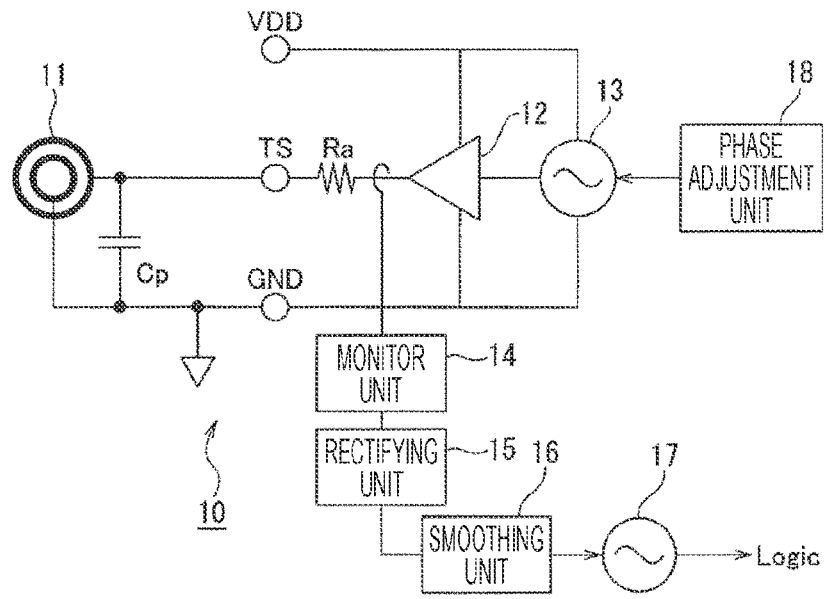
FIG. 1 is a block diagram of a touch sensor device according to an embodiment.

An embodiment of the present disclosure will be described below with reference to the drawings. In the description of the drawings referred to in the following description, the same or similar parts are denoted by the same or similar reference numerals, and redundant description is omitted. However, it should be noted that the drawings are schematic, and the relationship between thicknesses and plane dimensions, thickness ratio of devices or members, etc. are different from actual ones. Therefore, specific thicknesses and dimensions should be determined in consideration of the following description. In addition, it is obvious that the drawings include portions that are different in dimensional relationship and ratio among the drawings.

It should be noted that the effects described in the present specification are merely illustrative and not restrictive, and may have additional effects.

Embodiment

<Configuration of Touch Sensor Device>

As illustrated in FIG. 1, a touch sensor device 10 according to an embodiment of the present disclosure includes a touch electrode 11, a driver unit 12, a voltage oscillation unit 13, a monitor unit 14, a rectifying unit 15, a smoothing unit 16, a current oscillation unit 17, and a phase adjustment unit 18.

A self-capacitance detection type touch key (not illustrated) is connected to the touch electrode 11. The touch electrode 11 has a characteristic in which the capacitance of a capacitor Cp connected in parallel with the touch electrode 11 changes when the user touches the touch key. Here, "the user touches the touch key" means that the user puts his/her finger on an insulating film (not illustrated) on the touch electrode 11.

The driver unit 12 is connected to the touch electrode 11 via a resistor Ra and a terminal TS. Then, the driver unit 12 drives the touch electrode 11 with, for example, a triangular wave voltage output from the voltage oscillation unit 13. The voltage oscillation unit 13 outputs the triangular wave voltage by a power supply voltage supplied via a power supply terminal VDD.

The monitor unit 14 monitors a drive current obtained by driving the touch electrode 11. This drive current has a differential relation with the voltage waveform, and has a positive and negative rectangular wave.

The rectifying unit 15 performs full-wave rectification of the current monitored by the monitor unit 14. The smoothing unit 16 smooths the current rectified by the rectifying unit 15 and converts the current into a current corresponding to the capacitance of the capacitor Cp of the touch electrode 11.

The current oscillation unit 17 outputs a frequency signal as a sensor signal according to the output current of the smoothing unit 16. In the current oscillation unit 17, the oscillation frequency changes according to the capacitance of the capacitor Cp of the touch electrode 11. The sensor signal described above is supplied to a logic (not illustrated) in a subsequent stage. In the logic, whether or not the user touches the touch electrode 11 can be detected by detecting a change in the frequency of the sensor signal in a predetermined time.

The phase adjustment unit 18 sets the phase of the triangular wave output from the voltage oscillation unit 13 periodically or in response to an instruction for adjustment given by the user.

Figure 2:
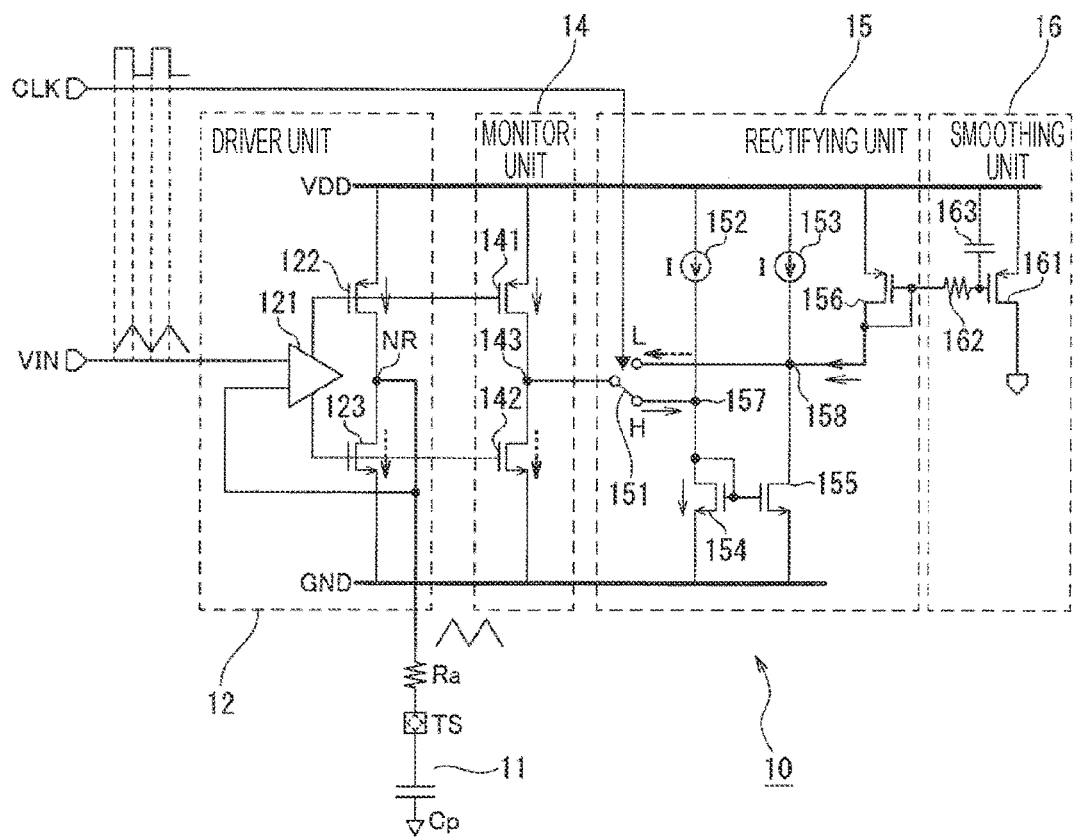
FIG. 2 is an equivalent circuit diagram illustrating details of the touch sensor device according to the embodiment.

FIG. 2 is an equivalent circuit diagram illustrating details of the touch sensor device 10.

The driver unit 12 includes an amplifier 121, a p-type field effect transistor (FET) 122, and an n-type FET 123. The monitor unit 14 includes a p-type FET 141 and an n-type FET 142. A power supply voltage VDD is applied to a source of the p-type FET 122, and a drain thereof is connected to a node NR. The node NR is connected to a source of the n-type FET 123, and a drain of the n-type FET 123 is grounded (referred to as GND hereinafter). A triangular wave voltage VIN output from the voltage oscillation unit 13 is applied to one of input terminals of the amplifier 121, and a drain voltage of the p-type FET 122 is applied to the other input terminal via the node NR.

The amplifier 121 controls the gate voltages of the p-type FET 122 and the n-type FET 123 so that the drain voltage of the p-type FET 122, that is, the voltage of the node NR becomes equal to the triangular wave voltage VIN. Then, the voltage VDDR is generated at the node NR.

When the user touches the touch electrode 11 with his/her finger, the value of the current flowing through the p-type FET 122 and the n-type FET 123 increases with an increase in the value of the capacitor Cp. Conversely, when the user moves his/her finger away from the touch electrode 11, the value of the current flowing through the p-type FET 122 and the n-type FET 123 decreases with a decrease in the value of the capacitor Cp.

The p-type FET 141 has a source applied with the power supply voltage VDD, and a gate connected to a gate of the p-type FET 122. The n-type FET 142 has a source to which a drain of the p-type FET 141 is connected, a gate connected to the gate of the n-type FET 123, and a drain which is grounded. The p-type FET 122, the n-type FET 123, the p-type FET 141, and the n-type FET 142 form a current mirror circuit.

The rectifying unit 15 includes a switch 151, constant current sources 152 and 153, n-type FETs 154 and 155, and a p-type FET 156. The n-type FET 154 has a source connected to the constant current source 152, a gate connected to a gate of the n-type FET 155, and a drain that is grounded.

The switch 151 switches between a connection point 157 between the constant current source 152 and the n-type FET 154 and a connection point 143 between the p-type FET 141 and the n-type FET 142 of the monitor unit 14, and between a connection point 158 between the constant current source 153 and the n-type FET 155 and a connection point 143 between the p-type FET 141 and the n-type FET 142, in response to a clock synchronized with the triangular wave. The p-type FET 156 has a source applied with the power supply voltage VDD, and a drain connected to the connection point 158 between the constant current source 153 and the n-type FET 155.

The smoothing unit 16 includes a p-type FET 161, a resistor 162, and a capacitor 163. A source is connected to a gate of the p-type FET 156, and one end of the resistor 162 constituting the smoothing unit 16 is connected to the gate. The other end of the resistor 162 is connected to one end of the capacitor 163 and the gate of the p-type FET 161. The power supply voltage VDD is applied to the other end of the capacitor 163. The power supply voltage VDD is applied to a source of the p-type FET 161.

<Description of Conventional Problems>

Problem 1: Efficiency of acquiring signal component

Problem 2: Countermeasure for slow noise

Problem 3: Countermeasure for radiation noise

<Efficiency of Acquiring Signal Component>

Figure 3:
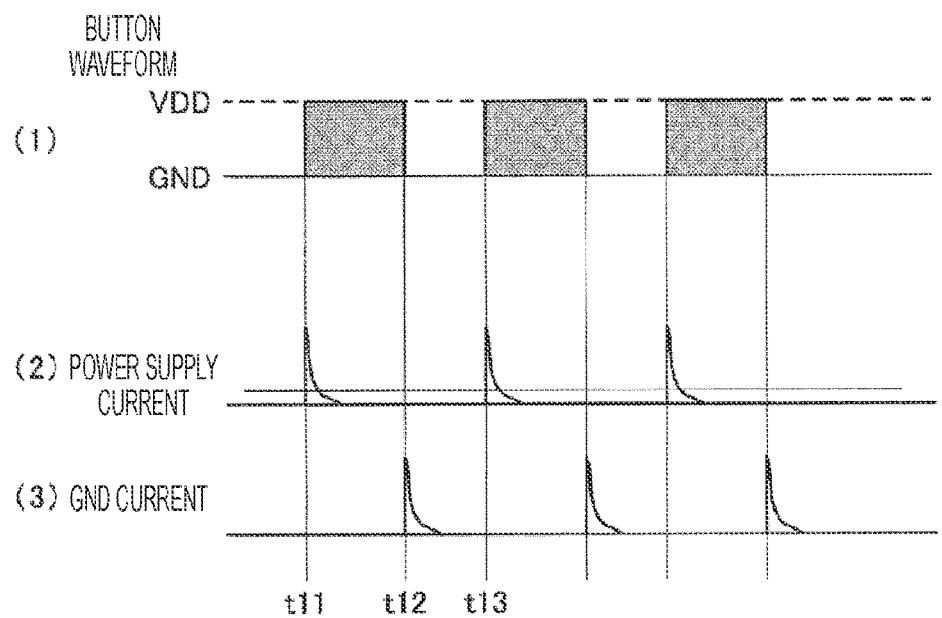
FIG. 3 is a timing chart of a touch sensor device according to a comparative example for describing efficiency of acquiring a signal component.

Problem 1 lies in low efficiency when the capacitance of the touch electrode is converted into a current. In the above Patent Document 1, an operation of charging the touch electrode to the power supply level in a section (t11 to t12) and then discharging the touch electrode to GND in a section (t12 to t13) is repeated as illustrated in FIG. 3(1). During this operation, only the current to be charged to the power supply level illustrated in FIG. 3(2) is extracted, and the discharge current illustrated in FIG. 3(3) does not make sense as touch information in the section (t12 to t13) in which the touch electrode is discharged to GND. For example, in a case where charging and discharging are repeated with a duty of 50% as illustrated in FIG. 3, 50% is a useless section.

In the embodiment of the present disclosure, the capacitor Cp of the touch electrode 11 is charged and discharged by the amplifier 121, and the charge/discharge current is monitored by the monitor unit 14. The amplifier 121 turns on the p-type FETs 122 and 141 and turns off the n-type FETs 123 and 142 in a section (t21 to t22 in FIG. 4) in which the input triangular wave illustrated in FIG. 4(1) rises. Then, a current (BUF current) I1 illustrated in FIG. 4(2) flows through the p-type FETs 122 and 141.

The current I1 flowing through the p-type FET 122 is charged in the capacitor Cp of the touch electrode 11 via the node NR, the resistor Ra, and the terminal TS. On the other hand, the current I1 flowing through the p-type FET 141 flows through the n-type FET 154 via the switch 151 of the rectifying unit 15. The n-type FET 154 is turned on by the current flowing through the gate, and a constant current output from the constant current source 152 and the current I1 from the p-type FET 141 flow between the source and the drain of the n-type FET 154. When the n-type FET 154 is turned on, the n-type FET 155 is also turned on, and a constant current output from the constant current source 153 and the current from the p-type FET 156 flow between the source and the drain of the n-type FET 155. At this time, the p-type FET 141, the constant current sources 152 and 153, and the p-type FET 156 are connected in parallel, and the voltages applied between the source and the drain of the n-type FETs 154 and 155 are substantially the same, so that the voltage applied between the source and the drain of the p-type FET 141 and the voltage applied between the source and the drain of the p-type FET 156 are substantially the same. Therefore, substantially the same current as the current I1 flowing between the source and the drain of the p-type FET 156 flows between the source and the drain of the p-type FET 141. Note that the constant current source 152 is adjusted so that a constant current flows through the n-type FET 154, and the constant current source 153 is adjusted so that a constant current flows through the n-type FET 155.

Subsequently, the amplifier 121 turns on the n-type FETs 123 and 142 and turns off the p-type FETs 122 and 141 in a section (t22 to t23 in FIG. 4) in which the input triangular wave illustrated in FIG. 4(1) falls. Then, a current I2 discharged from the capacitor Cp flows to the n-type FET 123 via the terminal TS, the resistor Ra, and the node NR. At this time, the switch 151 is switched to connect the connection point 143 and the connection point 158. Then, the current flowing between the source and the drain of the p-type FET 156 flows to the n-type FET 142 via the switch 151 and the connection point 143. The current output from the constant current source 153 and the current flowing between the source and the drain of the p-type FET 156 flow between the source and the drain of the n-type FET 142.

Figure 4:
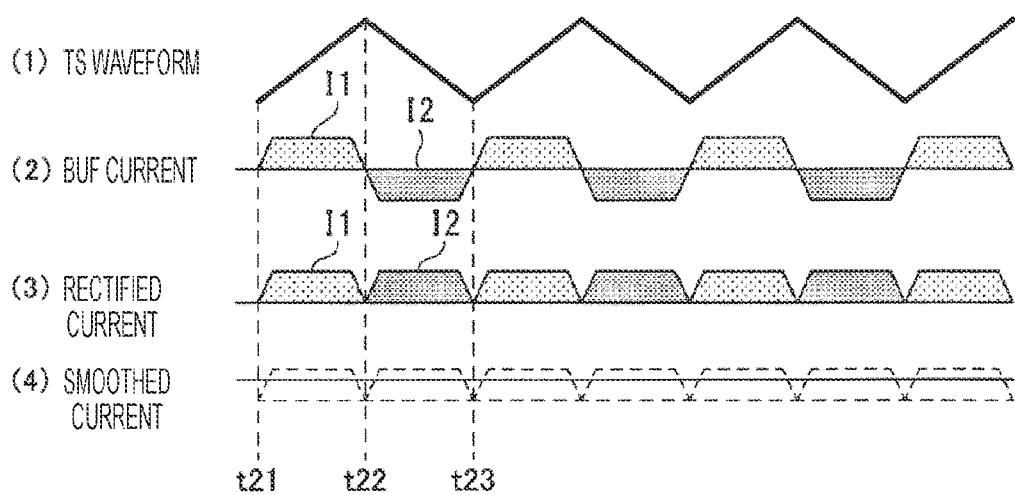
FIG. 4 is a timing chart of the touch sensor device according to the embodiment for describing efficiency of acquiring a signal component.

Since substantially the same current as the current flowing through the p-type FET 141 flows between the source and the drain of the p-type FET 156 at the rising of the triangular wave illustrated in FIG. 4(1), and substantially the same current as the current flowing through the n-type FET 142 flows at the falling of the triangular wave, the rectified current illustrated in FIG. 4(3) flows through the resistor 162 of the smoothing unit 16.

The rectified current is relatively flat, but due to some delay time by the driver unit 12, the rectified current is slightly discontinuous. Since the current discharged from the capacitor 163 is also supplied to the gate of the p-type FET 161, the current illustrated in FIG. 4(4) flows between the source and the drain of the p-type FET 161.

Therefore, the signal component can be extracted during both charging and discharging. As a result, it is possible to extract the signal component with twice the efficiency of the configuration disclosed in Patent Document 1 described above.

<Countermeasure for Slow Noise>

Figure 5A:
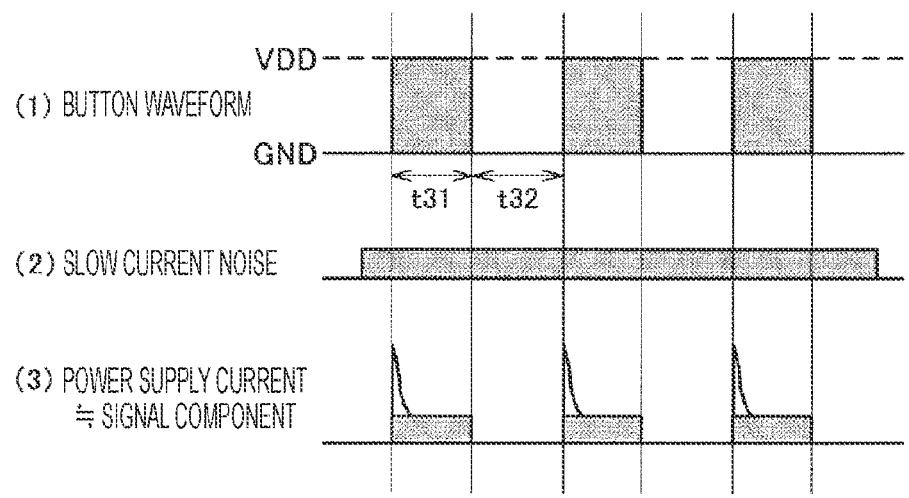
FIGS. 5A and 5B are timing charts of a touch sensor device according to a comparative example for describing a countermeasure for noise.
Figure 5B:
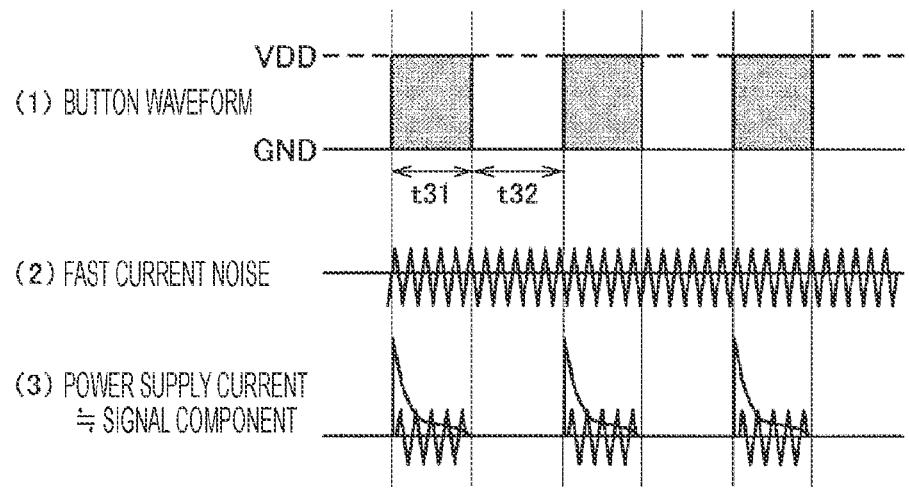

Problem 2 is resistance to disturbance noise. FIGS. 5A and 5B illustrate a countermeasure example for disturbance noise that can be regarded as direct current (DC) and high-speed disturbance noise such as an RF band. In Patent Document 1 described above, the operation of charging the touch electrode to the power supply level in a section (t31) and then discharging the touch electrode to GND in a section (t32) is repeated as illustrated in FIGS. 5A(1) and 5B(1). During this operation, only the current to be charged to the power supply level is extracted.

At this time, when a slow current noise that can be regarded as DC illustrated in FIG. 5A(2) is generated in the current, the noise is superimposed as illustrated in FIG. 5A(3).

In Patent Document 1 described above, when a high-speed current noise such as an RF band is generated as illustrated in FIG. 5B(2), the noise is superimposed as illustrated in FIG. 5B(3).

In addition, in Patent Document 1 described above, disturbance noise that can be regarded as direct current (DC) and high-speed disturbance noise such as an RF band enter via a low-resistance switch. Therefore, noise and a signal cannot be distinguished from each other, and thus, the noise cannot be canceled.

<Countermeasure for Slow Noise>

In the embodiment of the present disclosure, as illustrated in FIG. 6A, when disturbance noise (1-2) that can be regarded as DC occurs in a triangular wave (1-1) output from the voltage oscillation unit 13, the current monitored by the monitor unit 14 is full-wave rectified, whereby the noise that can be regarded as DC is superimposed on a signal component in an increasing direction during charging (1-3), and the noise is superimposed on the signal component in a decreasing direction during discharging (1-4), for example. The noise can be canceled by adding the current during charging and the current during discharging (1-5).

<Countermeasure for Fast Noise>

In addition, in the embodiment of the present disclosure, as illustrated in FIG. 6B, when fast RF noise (2-2) with, for example, several hundred MHz occurs in the triangular wave (2-1) output from the voltage oscillation unit 13, the noise is not monitored and not superimposed on the signal (2-3, 2-4, 2-5) by limiting the band of the amplifier 121 of the driver unit 12 to, for example, several MHz.

On the other hand, as illustrated in FIG. 7, when disturbance noise (FIG. 7(2)) synchronized with the triangular wave (FIG. 7(1)) output from the voltage oscillation unit 13 occurs in the embodiment of the present disclosure, the disturbance noise is superimposed on the signal component in the increasing direction during charging (FIG. 7(3)), and the disturbance noise is superimposed on the signal component in the increasing direction during discharging, for example, despite the full-wave rectification of the current monitored by the monitor unit 14 (FIG. 7(4)). Therefore, even if the current during charging and the current during discharging are added, the noise cannot be canceled as illustrated in FIG. 7(5).

Figure 8:
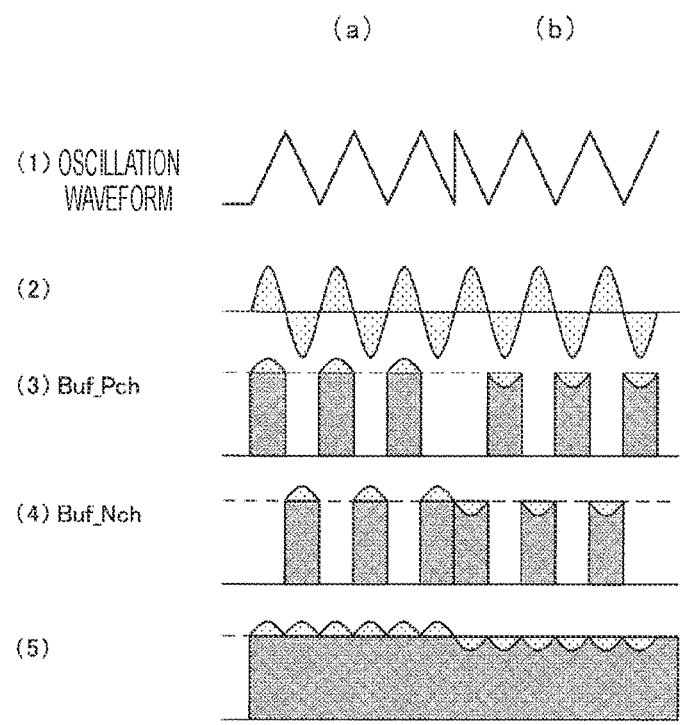
FIG. 8 is a timing chart of the touch sensor device according to the embodiment when a phase of the oscillation waveform is adjusted.

To address this problem, the embodiment of the present disclosure divides the triangular wave (FIG. 8(1)) output from the voltage oscillation unit 13 into a section (a) and a section (b), and sets the phase of the waveform in the section (b) to be shifted by 180° from the waveform in the section (a) by the phase adjustment unit 18 as illustrated in FIG. 8. With this configuration, when the disturbance noise (FIG. 8(2)) synchronized with the triangular wave (FIG. 8(1)) output from the voltage oscillation unit 13 occurs, the noise is, for example, superimposed on the signal component in the increasing direction in the section (a) and superimposed on the signal component in the decreasing direction in the section (b) during charging (FIG. 8(3)) due to full-rectification of the current monitored by the monitor unit 14. On the other hand, during discharging, the noise is superimposed on the signal component in the increasing direction in the section (a) and is superimposed on the signal component in the decreasing direction in the section (b) (FIG. 8(4)), for example. The noise can be canceled by adding the current during charging and the current during discharging (FIG. 8(5)).

Figure 9:
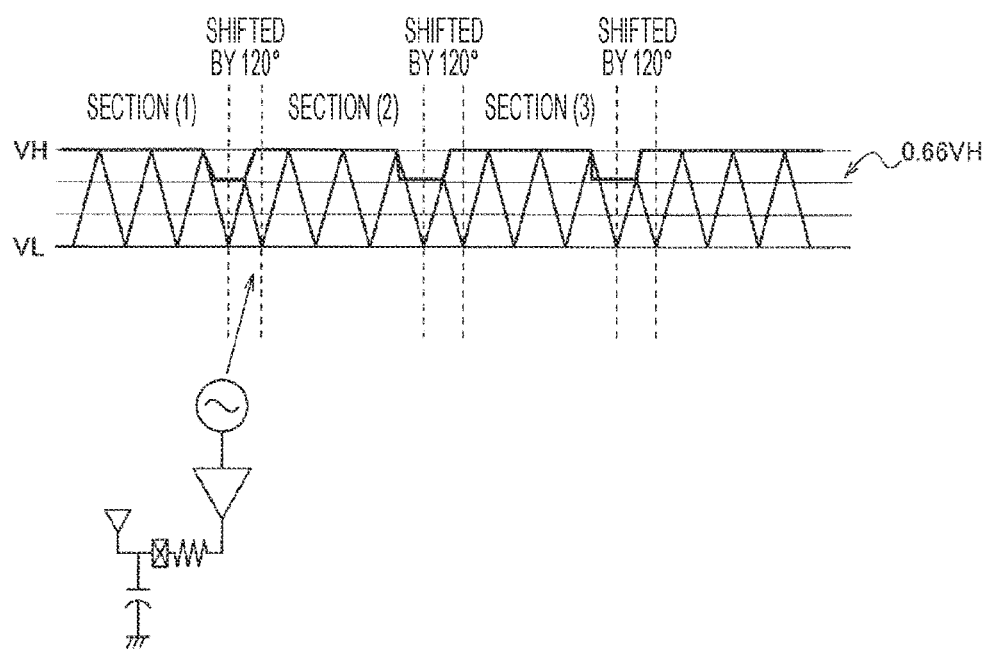
FIG. 9 is another timing chart of the touch sensor device according to the embodiment when the phase of the oscillation waveform is adjusted.

Alternatively, as illustrated in FIG. 9, the embodiment of the present disclosure divides the triangular wave output from the voltage oscillation unit 13 into a section (1), a section (2), and a section (3), and sets the phase of the waveform in the section (2) to be shifted by 120° from the waveform in the section (1) and the phase of the waveform in the section (3) to be shifted by 120° from the waveform in the section (2) by the phase adjustment unit 18. Thus, the triangular wave has three phases and is averaged.

The phase adjustment unit 18 sets the phase of the waveform in each of the divided sections (1), (2), and (3) output from the voltage oscillation unit 13 so that amounts of phase change of the waveform in the sections (1), (2), and (3) total 360°. In this case, for example, the phase adjustment unit 18 counts 32 32 k clocks, and at that time, sets the voltage value of the triangular wave output from the voltage oscillation unit 13 to 0.66 times only once. With this configuration, the noise can be canceled.

<Reduction of Radiation Noise>

Problem 3 is radiation noise. In Patent Document 1 described above, in a case where the touch electrode is driven by the switched capacitor as illustrated in FIG. 10A, the charge current illustrated in FIG. 10B and the discharge current illustrated in FIG. 10C have differential waveforms of rectangular waves, and have peaks. This peak current may become an interfering wave at the time of RF reception by passing through a loop between the circuit and the touch electrode.

Figures 11A, 11B:
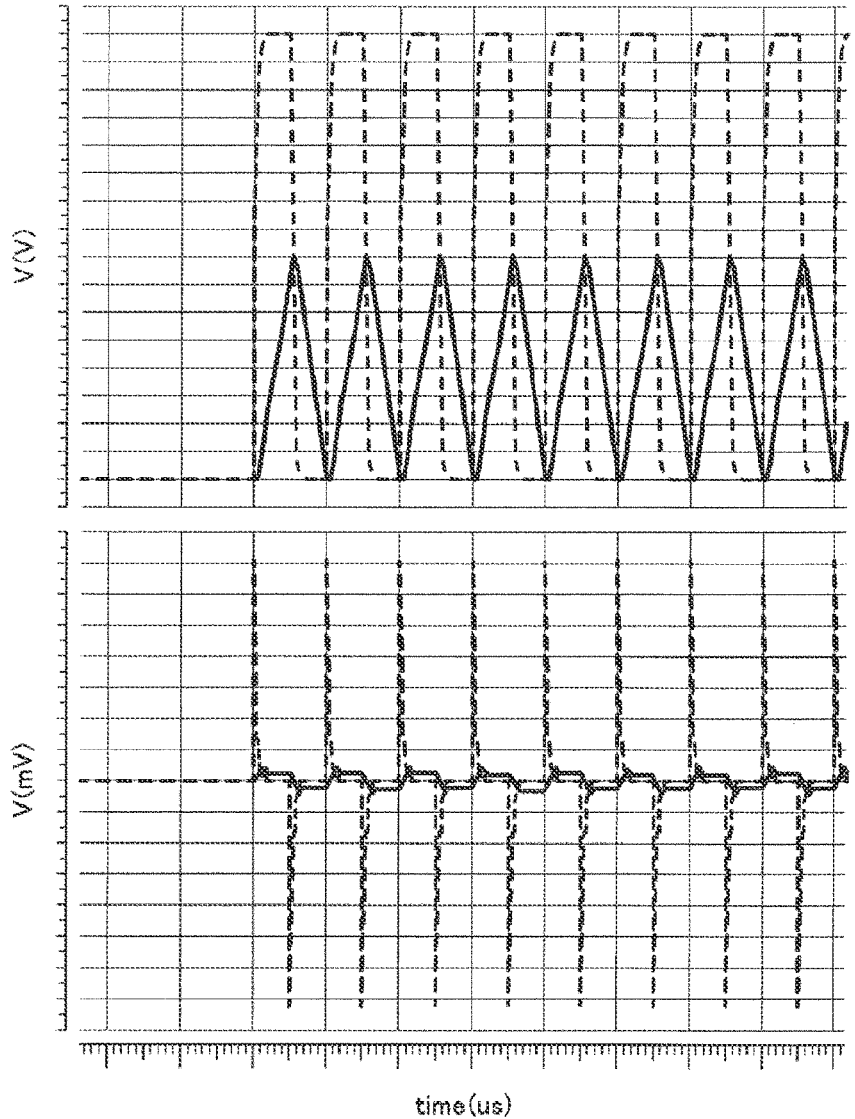
FIGS. 11A and 11B are timing charts of the touch sensor device according to the embodiment for describing radiation noise.

In the embodiment of the present disclosure, the touch electrode 11 is driven with a triangular wave voltage as indicated by a solid line in FIG. 11A, by which a charge/discharge current indicated by a solid line in FIG. 11B has a differential waveform of the triangular wave and thus becomes flat. Therefore, the current peak can be greatly reduced as compared with the configuration using the switched capacitor indicated by the dotted line in FIG. 11B.

Operation and Effect of Embodiment

According to the embodiment, the touch electrode 11 is charged and discharged with the triangular wave voltage output from the voltage oscillation unit 13 using the driver unit 12, the charge/discharge current is monitored by the monitor unit 14, and the monitored current is full-wave rectified by the rectifying unit 15, so that it is possible to extract signal components during both charging and discharging.

In addition, according to the embodiment, the phase of the waveform in each section obtained by dividing the triangular wave output from the voltage oscillation unit 13 is set by the phase adjustment unit 18 such that amounts of phase change of the waveform in the respective sections total 360°, whereby the noise synchronized with the triangular wave can be canceled. In particular, in a case where the triangular wave is divided into two sections, the phases of the waveform are inverted and added, whereby noise synchronized with the triangular wave can be canceled.

In addition, according to the embodiment, the band of the amplifier 121 of the driver unit 12 is limited to, for example, several MHz in order to address fast noise with, for example, several hundred MHz in an RF band. With this configuration, the noise is not monitored and not superimposed on the signal.

Therefore, the signal component can be extracted with twice the efficiency of the configuration in which the touch electrode 11 is driven by the switched capacitor, and thus a touch button can be reduced in size. In addition, as compared with the configuration in which the touch electrode 11 is driven by the switched capacitor, a current peak generated in the charge/discharge current can be reduced, and thus, reduction in radiation noise can be achieved. Furthermore, the touch electrode 11 is driven with the triangular wave voltage, whereby the current rectified by the rectifying unit 15 can be made flat, and thus, the radiation noise is reduced.

MODIFICATION

A touch sensor device according to the modification of the embodiment has a configuration similar to the configuration of the touch sensor device 10 according to the embodiment, except that the touch sensor device 10 according to the modification uses, in place of a triangular waveform voltage, a sinusoidal waveform voltage that gradually changes from a first voltage value that is higher than a reference voltage value, "0" for example, to a second voltage value that is lower than the reference voltage value, and from the second voltage value to the first voltage value.

The touch sensor device according to the modification of the embodiment will be described with reference to a timing charts of FIGS. 12A, 12B, and 12C. In the modification of the embodiment of the present disclosure, the touch electrode 11 is driven with a sinusoidal waveform voltage as illustrated in FIG. 12A, by which a charge/discharge current monitored by the monitor unit 14 has a differential waveform of the sinusoidal wave illustrated in FIG. 12B. The current monitored by the monitor unit 14 is converted into the current illustrated in FIG. 12C by full-wave rectification by the rectifying unit 15 and is supplied to the smoothing unit 16.

The smoothing unit 16 smooths the current rectified by the rectifying unit 15 and converts the current into a DC current corresponding to the capacitance of the capacitor Cp of the touch electrode 11.

Operation and Effect of Modification of Embodiment

According to the modification of the embodiment, the touch electrode 11 is driven using a sinusoidal wave voltage, whereby a signal component can also be extracted twice the efficiency of the configuration in which the touch electrode 11 is driven by the switched capacitor. In addition, as compared with the configuration in which the touch electrode 11 is driven by the switched capacitor, a current peak generated in the charge/discharge current can be reduced, whereby a reduction in radiation noise can be achieved.

Other Embodiments

While the present technology has been described above by way of the embodiment and the modification of the embodiment, it should not be understood that the description and drawings constituting a part of this disclosure limit the present technology. It will be apparent to those skilled in the art that various alternative embodiments, examples, and operation techniques may be included in the present technology when understanding the spirit of the technical content disclosed in the above embodiment. In addition, the configurations described in the embodiment and the modification of the embodiment can be appropriately combined as long as there is no contradiction. For example, configurations described in a plurality of different embodiments may be combined, or configurations described in a plurality of different modifications of the same embodiment may be combined.

Example of Application to Electronic Device

The technology according to the present disclosure can be applied to various products. For example, the technology according to the present disclosure can be applied to remote control of electronic devices such as a television, a set top box, a network box, a DVD player, and an audio system. The technology according to the present disclosure can also be used for controlling other network devices such as a thermostat, a lighting system, and household appliances.

FIG. 13 is a block diagram illustrating a schematic configuration example of a system for enabling remote control of an electronic device to which the technology according to the present disclosure can be applied. The technology according to the present disclosure is applied to, for example, a navigation device 1000.

In the example illustrated in FIG. 13, the navigation device 1000 is used to control one or more electronic devices 1020, such as televisions and set-top boxes, using a wireless communication link 1040. The navigation device 1000 includes a touch-sensitive pad 1060, and optionally one or more buttons or another control element 1080.

In one example, a description of the appearance of a control surface is included in a graphic file 1120. The graphic file 1120 can be generated by a manufacturer 1140 of the electronic device or a third party (also indicated as 1140). In the example in which the navigation device 1000 includes the touch-sensitive pad 1060, the graphic file 1120 can be copied to a memory of the navigation device 1000 via a wired link 1160 or a wireless link 1180, or can be preprogrammed in advance into the memory of the navigation device 1000.

The wired link 1160 or the wireless link 1180 may include a computer network such as the Internet. In addition, the graphic file 1120 is copied to a memory of the electronic device 1020 by a wired link 1200 or a wireless link 1220, or is programmed in advance in the memory of the electronic device 1020.

The manufacturer 1140 can use the common navigation device 1000 for the plurality of electronic devices 1020, so that a reduction in cost can be achieved.

It is to be noted that the present disclosure may also have the following configurations.

(1)

A touch sensor device including:
- a driver unit that drives an electrode having a capacitance that changes due to contact, using a voltage having a waveform of any shape, the voltage gradually changing from a first voltage value that is higher than a reference voltage to a second voltage value that is lower than the reference voltage, and from the second voltage value to the first voltage value;
- a monitor unit that monitors a drive current obtained by driving the electrode;
- a rectifying unit that performs full-wave rectification of the current monitored by the monitor unit; and
- a smoothing unit that smooths the rectified current and converts the rectified current to a current that corresponds to the capacitance of the electrode.

(2)

The touch sensor device according to (1), in which the driver unit drives the electrode with a triangular wave voltage.

(3)

The touch sensor device according to (1), in which the driver unit includes a phase adjustment unit that sets a phase of the waveform.

(4)

The touch sensor device according to (3), in which the phase adjustment unit divides the waveform into at least two or more sections, and sets the phase of the waveform in each of the sections so that amounts of phase change of the waveform in the divided sections total 360°.

(5)

The touch sensor device according to (4), in which the phase adjustment unit sets the phase of the waveform in one section to be shifted by 180° from the phase of the waveform in the other section.

(6)

The touch sensor device according to (4), in which the phase adjustment unit sets the phase of the waveform in one section to be shifted by 120° from the phase of the waveform in the other section.

(7)

The touch sensor device according to (1), in which the driver unit includes a voltage generation unit that generates a voltage of the waveform, and an amplification unit that drives the electrode on the basis of an output of the voltage generation unit, the driver unit limiting a band of the amplification unit to a frequency band lower than a wireless radio frequency band.

(8)

An electronic device including a touch sensor device that includes:
- a driver unit that drives an electrode having a capacitance that changes due to contact, using a voltage having a waveform of any shape, the voltage gradually changing from a first voltage value that is higher than a reference voltage to a second voltage value that is lower than the reference voltage, and from the second voltage value to the first voltage value;
- a monitor unit that monitors a drive current obtained by driving the electrode;
- a rectifying unit that performs full-wave rectification of the current monitored by the monitor unit; and
- a smoothing unit that smooths the rectified current and converts the rectified current to a current that corresponds to the capacitance of the electrode.

REFERENCE SIGNS LIST

10 Touch sensor device
11 Touch electrode
12 Driver unit
13 Voltage oscillation unit
14 Monitor unit
15 Rectifying unit
16 Smoothing unit
17 Current oscillation unit
18 Phase adjustment unit
121 Amplifier
122, 141, 156, 161 p-type FET
123, 142, 154, 155 n-type FET
143, 157, 158 Connection point
151 Switch
152, 153 Constant current source
162, Ra Resistor
163, Cp Capacitor
1000 Navigation device
1020 Electronic device
1040 Wireless communication link
1060 Touch-sensitive pad
1080 Another control element
1100 Display screen
1120 Graphic file
1140 Manufacturer
1160 Wired link
1180 Wireless link

The invention claimed is:

1. A touch sensor device, comprising:
   circuitry configured to:
      drive an electrode having a capacitance that changes due to contact, wherein
         the electrode is driven based on a voltage having a waveform of a specific shape,
         the voltage gradually changes from a first voltage value that is higher than a reference voltage to a second voltage value that is lower than the reference voltage, and from the second voltage value to the first voltage value;
      monitor a drive current obtained by a driving operation of the electrode;
      perform full-wave rectification of the monitored drive current;
      smooth the rectified drive current; and
      convert the rectified drive current, that is smoothened, to a current that corresponds to the capacitance of the electrode.

2. The touch sensor device according to claim 1, wherein the circuitry is further configured to drive the electrode with a triangular wave voltage.

3. The touch sensor device according to claim 1, wherein the circuitry is further configured to set a phase of the waveform.

4. The touch sensor device according to claim 3, wherein the circuitry is further configured to:
   divide the waveform into at least two sections; and
   set the phase of the waveform in each of the divided at least two sections so that amounts of phase change of the waveform in the divided at least two sections total 360°.

5. The touch sensor device according to claim 4, wherein the circuitry is further configured to set the phase of the waveform in a first section, of the at least two sections, to be shifted by 180° from the phase of the waveform in a second section of the at least two sections.

6. The touch sensor device according to claim 4, wherein the circuitry is further configured to set the phase of the waveform in a first section, of the at least two sections, to be shifted by 120° from the phase of the waveform in a second section of the at least two sections.

7. An electronic device, comprising:
   a touch sensor device that includes circuitry, wherein the circuitry is configured to:
      drive an electrode having a capacitance that changes due to contact, wherein
         the electrode is driven based on a voltage having a waveform of a specific shape,
         the voltage gradually changes from a first voltage value that is higher than a reference voltage to a second voltage value that is lower than the reference voltage, and from the second voltage value to the first voltage value;
      monitor a drive current obtained by a driving operation of the electrode;
      perform full-wave rectification of the monitored drive current;
      smooth the rectified drive current; and
      convert the rectified drive current, that is being smoothened, to a current that corresponds to the capacitance of the electrode.

* * * * *